United States Patent
Stanley

(10) Patent No.: US 9,018,942 B2
(45) Date of Patent: Apr. 28, 2015

(54) POSITION MEASUREMENT USING A VARIABLE FLUX COLLECTOR

(71) Applicant: Bourns, Inc., Riverside, CA (US)

(72) Inventor: James Gregory Stanley, Novi, MI (US)

(73) Assignee: Bourns, Inc., Riverside, CA (US)

( * ) Notice: Subject to any disclaimer, the term of this patent is extended or adjusted under 35 U.S.C. 154(b) by 281 days.

(21) Appl. No.: 13/739,712

(22) Filed: Jan. 11, 2013

(65) Prior Publication Data

US 2014/0197818 A1 Jul. 17, 2014

(51) Int. Cl.
G01B 7/14 (2006.01)
G01R 33/07 (2006.01)
G01B 7/00 (2006.01)

(52) U.S. Cl.
CPC ............... *G01R 33/07* (2013.01); *G01B 7/003* (2013.01)

(58) Field of Classification Search
USPC .................................................... 324/207.02
See application file for complete search history.

(56) References Cited

U.S. PATENT DOCUMENTS

| | | | | |
|---|---|---|---|---|
| 5,341,097 A * | 8/1994 | Wu | ............................ | 324/207.2 |
| 5,570,015 A | 10/1996 | Takaishi et al. | | |
| 5,627,465 A * | 5/1997 | Alfors et al. | ................ | 324/207.2 |
| 5,694,039 A * | 12/1997 | Alfors | ......................... | 324/207.2 |
| 5,889,400 A * | 3/1999 | Nakazawa | .................. | 324/207.2 |
| 6,097,183 A | 8/2000 | Goetz et al. | | |
| 6,246,561 B1 * | 6/2001 | Flynn | ............................. | 361/147 |
| 6,265,867 B1 * | 7/2001 | Fowler | ..................... | 324/207.25 |
| 6,552,532 B1 | 4/2003 | Sako | | |
| 6,653,830 B2 * | 11/2003 | Luetzow | .................. | 324/207.21 |
| 7,088,094 B2 * | 8/2006 | VunKannon, Jr. | ........ | 324/207.17 |
| 7,843,190 B2 | 11/2010 | Nishida et al. | | |
| 8,018,225 B2 * | 9/2011 | Weickert | ................... | 324/207.25 |
| 8,129,984 B2 * | 3/2012 | Hosek et al. | .............. | 324/207.24 |
| 8,729,889 B2 * | 5/2014 | Ghislanzoni | .............. | 324/207.23 |
| 2003/0112006 A1 * | 6/2003 | Luetzow | ................... | 324/207.21 |
| 2003/0122641 A1 * | 7/2003 | Luetzow | ........................ | 335/205 |
| 2006/0220638 A1 * | 10/2006 | Urquidi et al. | ............ | 324/207.25 |
| 2008/0257655 A1 * | 10/2008 | Ito et al. | ........................... | 187/406 |
| 2009/0108834 A1 * | 4/2009 | Kurth | ........................ | 324/207.13 |
| 2010/0045275 A1 | 2/2010 | Frachon | | |
| 2010/0301840 A1 | 12/2010 | Filatov | | |
| 2011/0133725 A1 * | 6/2011 | Dengler | ...................... | 324/207.2 |
| 2012/0161754 A1 * | 6/2012 | Irmscher et al. | .............. | 324/204 |
| 2013/0257417 A1 * | 10/2013 | Ely | ........................... | 324/207.22 |
| 2013/0264915 A1 * | 10/2013 | Suzuki et al. | ................ | 310/68 B |
| 2013/0268234 A1 * | 10/2013 | Janisch | .......................... | 702/151 |
| 2014/0266157 A1 * | 9/2014 | Stanley | ....................... | 324/207.2 |

FOREIGN PATENT DOCUMENTS

JP 2005214934 8/2005

\* cited by examiner

*Primary Examiner* — Benjamin M Baldridge
(74) *Attorney, Agent, or Firm* — Michael Best & Friedrich LLP

(57) ABSTRACT

A magnetically-based position sensor. The sensor includes a magnet assembly that moves along a path, a common collector, one or more magnetic sensing elements, a first variable collector, and a second variable collector. The one or more magnetic sensing elements are coupled to the common collector. The first and second variable collectors are coupled to one of the one or more magnetic sensors and are configured to collect a magnetic field. The first and second variable collectors are positioned to transmit some of the magnetic flux generated by the magnet assembly as the magnet assembly moves along the path. The first variable collector and the second variable collector have a geometry and orientation such that the flux collected by the first and second variable collectors varies as the magnet moves along the path.

17 Claims, 10 Drawing Sheets

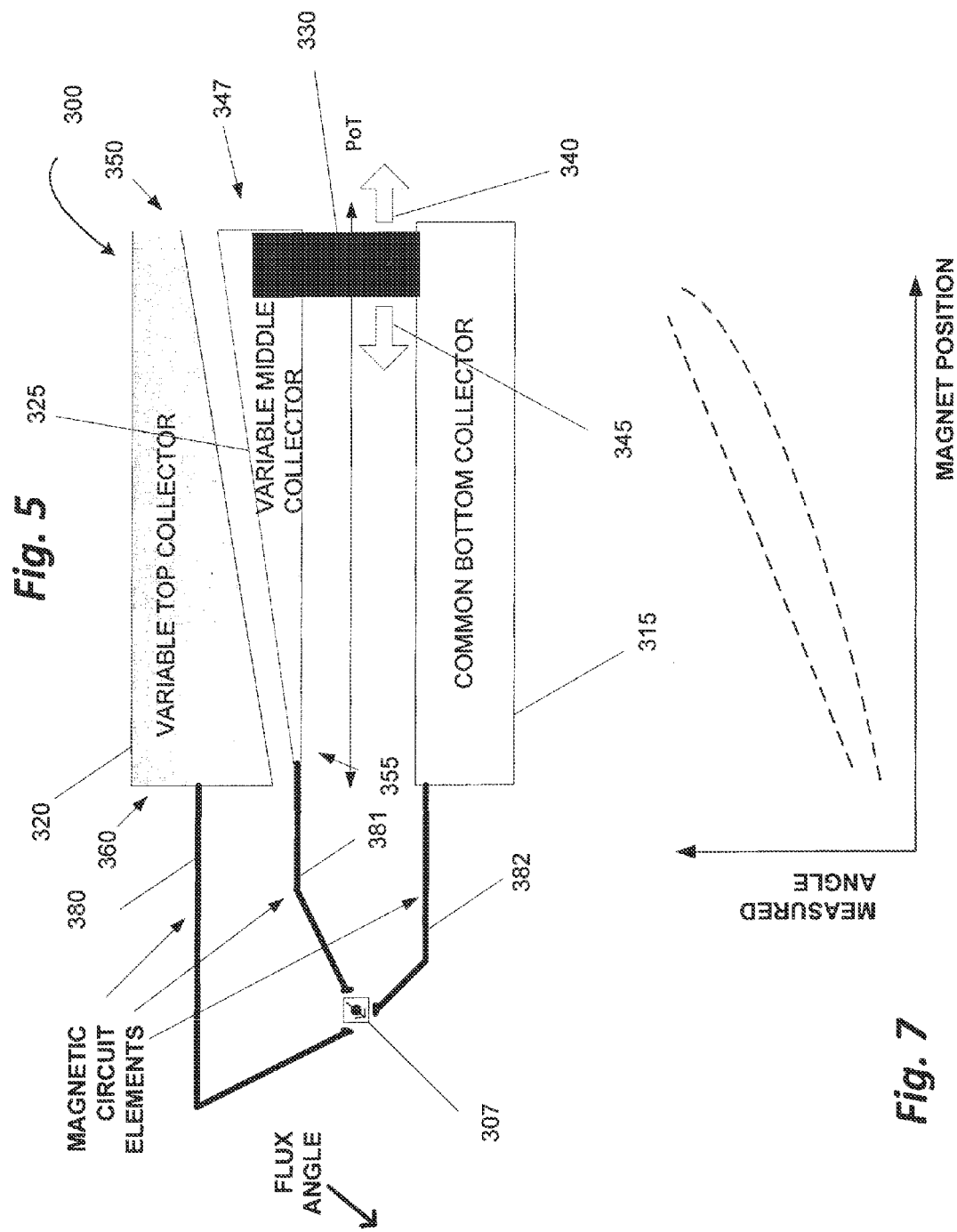

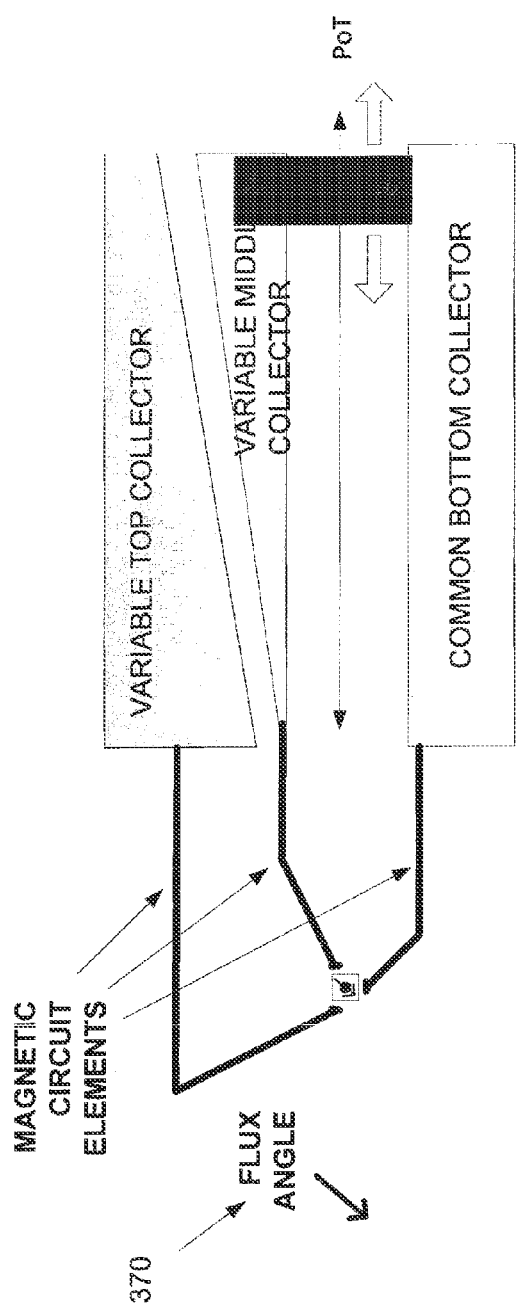
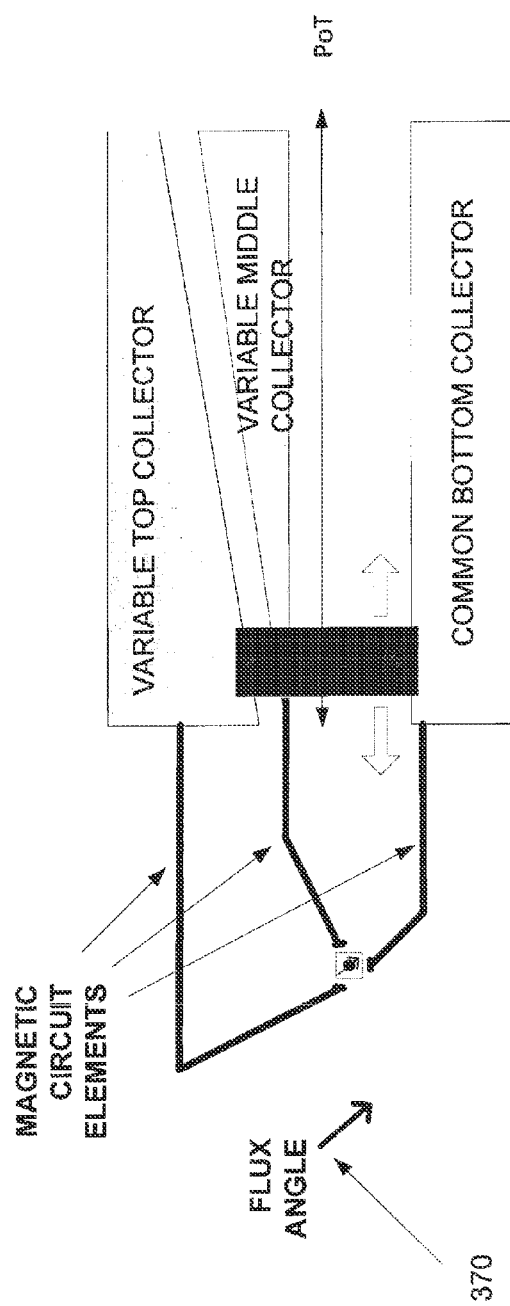
Fig. 6A
Fig. 6B

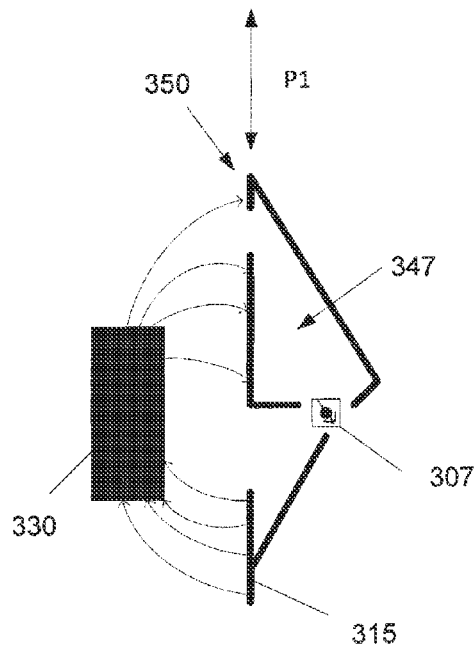 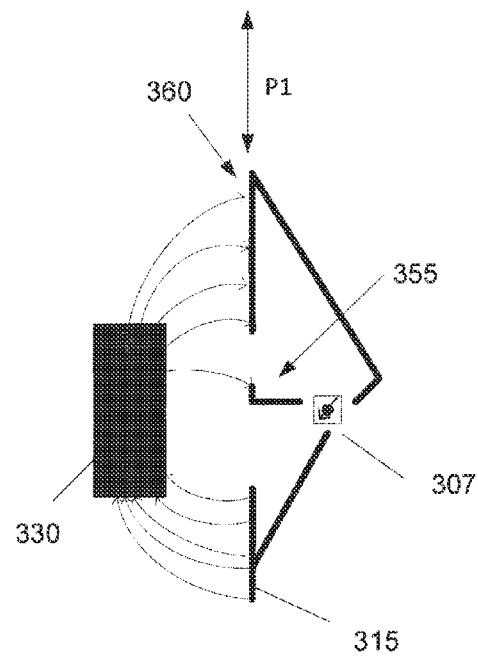
Fig. 8A　　　　　　　　　Fig. 8B
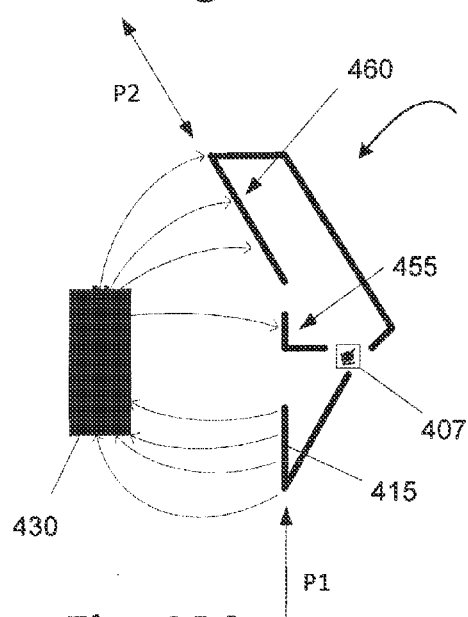 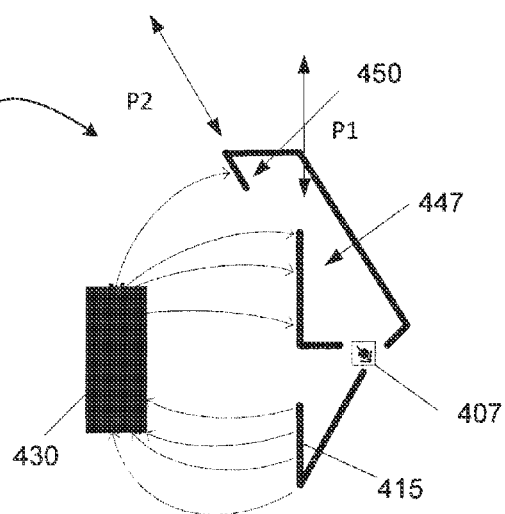
Fig. 10A　　　　　　　　　Fig. 10B

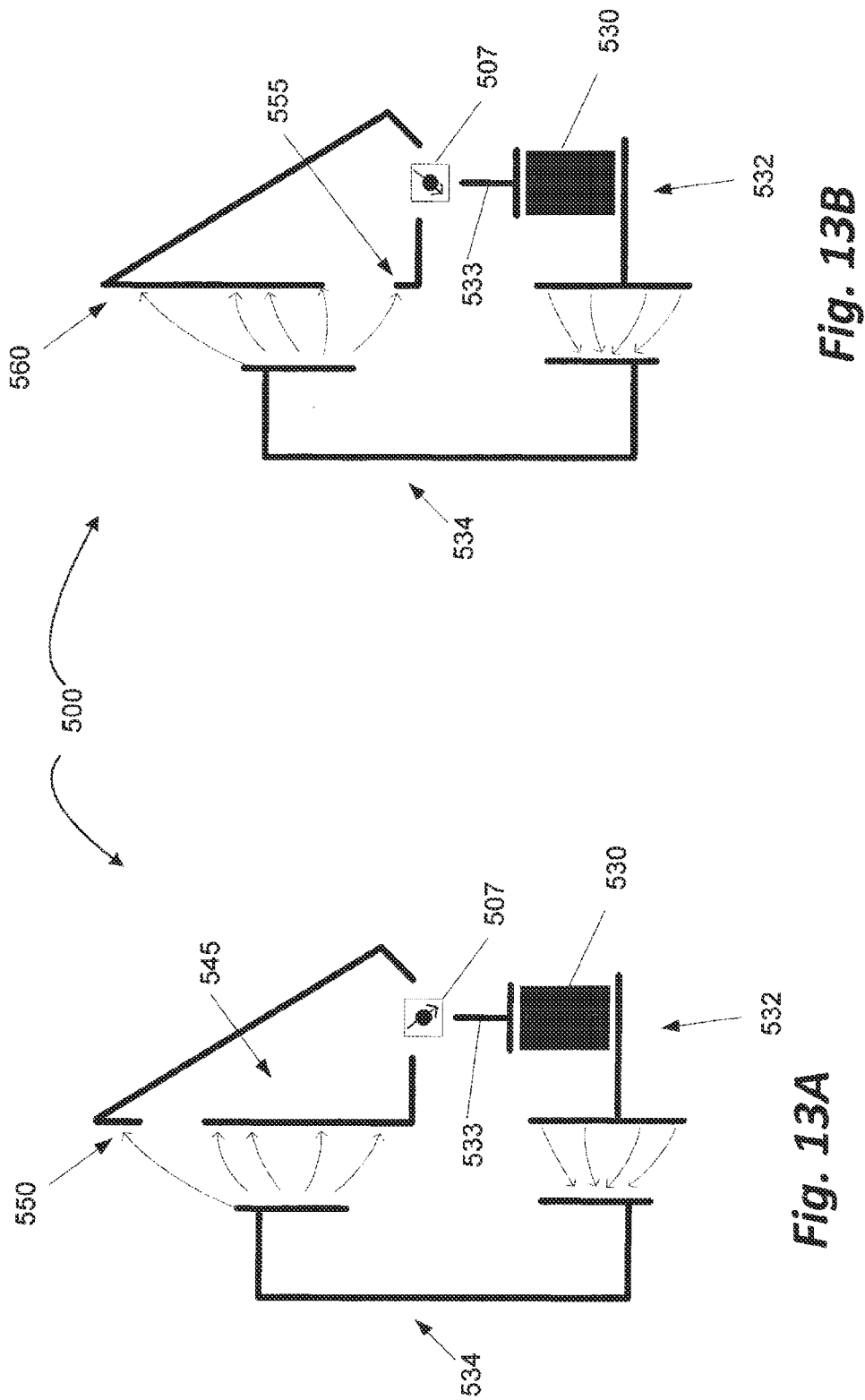

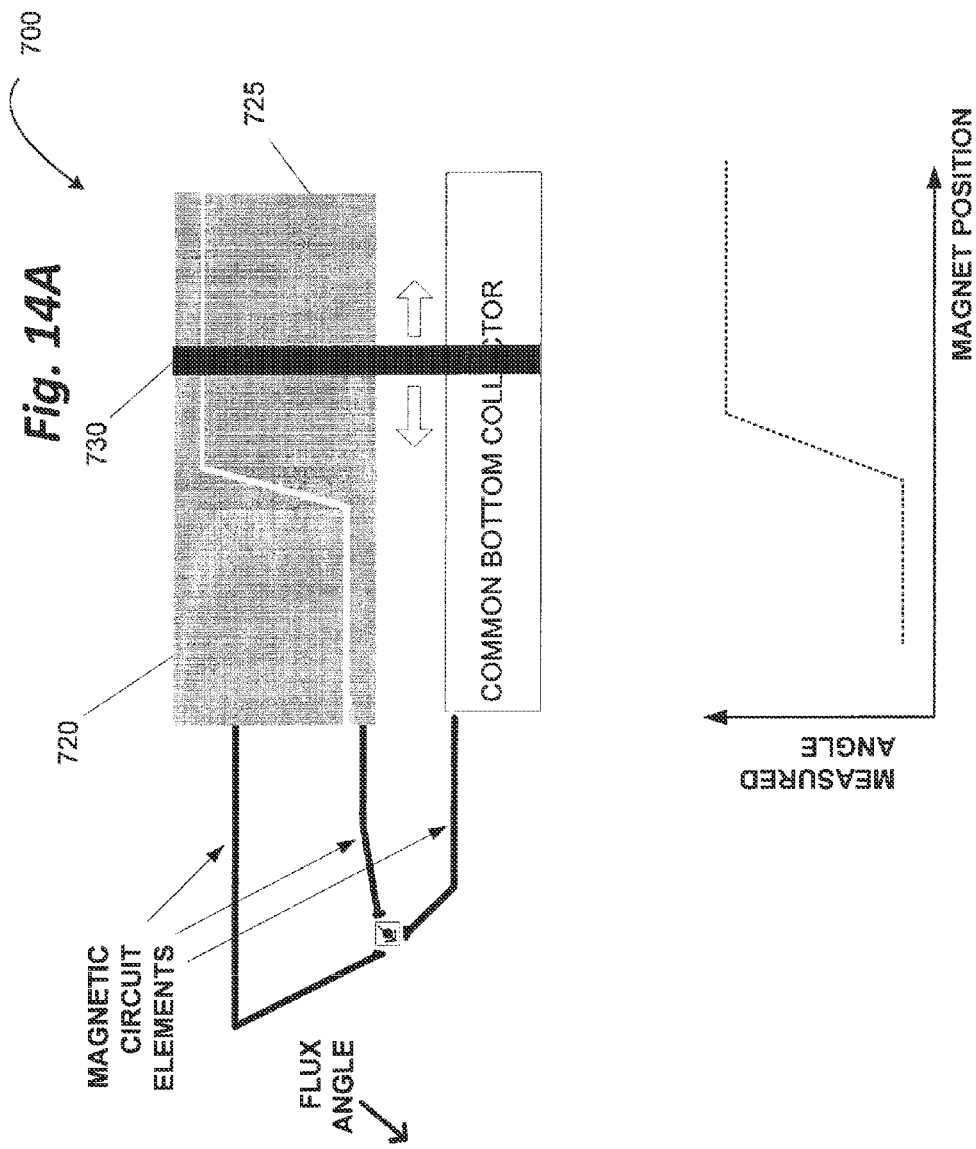

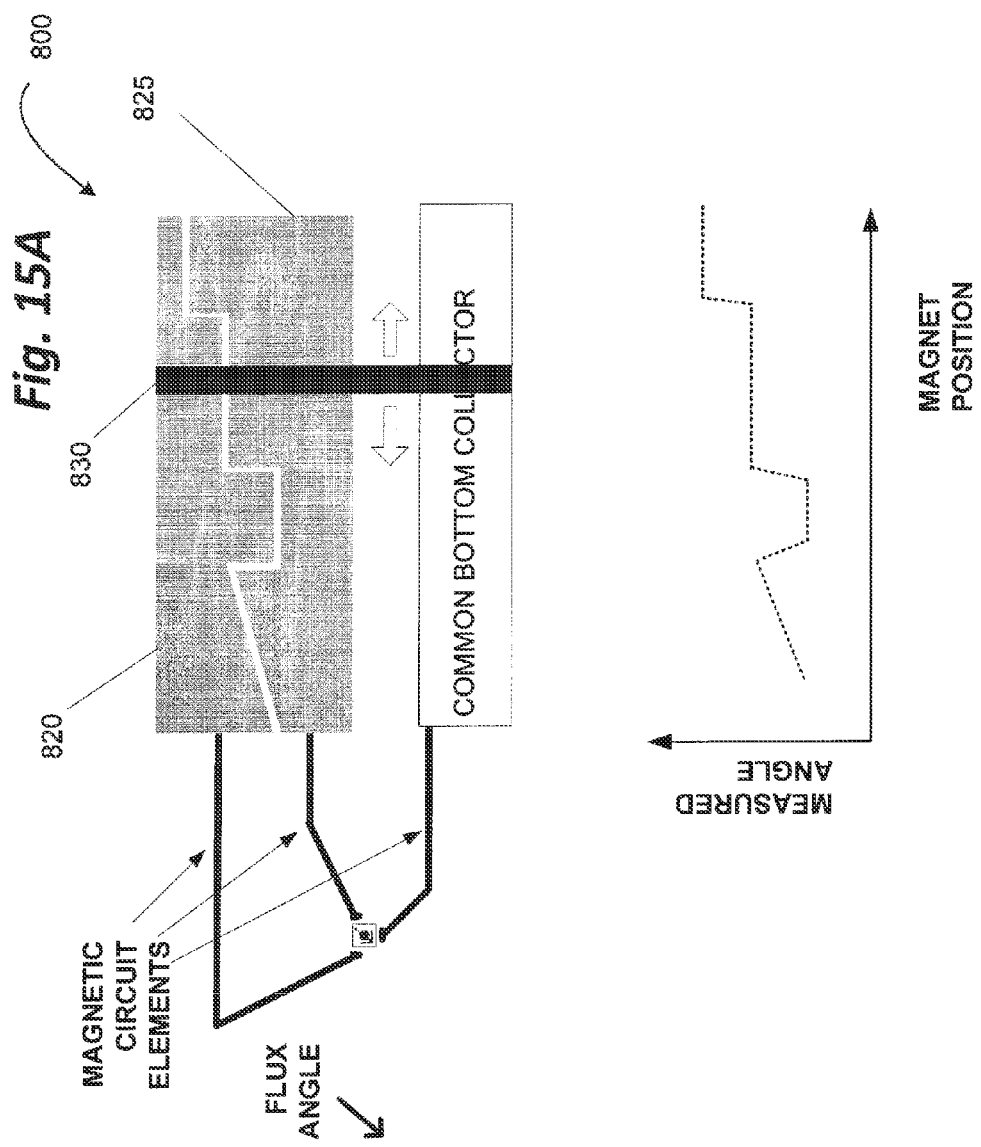

US 9,018,942 B2

POSITION MEASUREMENT USING A VARIABLE FLUX COLLECTOR

BACKGROUND

The present invention relates to position measurement using a magnetic sensor. More particularly, embodiments of the invention relate to repeatable position measurements by sensing a magnet's position relative to a set of flux collectors.

There are many known types of position sensors, including a number of magnetic position sensors. In a typical magnetic sensor, a magnet is connected or otherwise coupled to an element that moves. When the element moves, the magnet moves. Broadly speaking, changes in the magnetic field caused by movement of the magnet can be correlated to position. Magnetic sensing has many advantages over other technologies, including immunity to a "dirty" environment and relative simplicity when using commercially available sensing ICs (e.g., Hall-based and magnetoresistive sensors).

SUMMARY

One challenge or deficiency of current magnetic sensors relates to their inability to measure a long range while using a magnet whose largest linear dimension is a small fraction of the measurement range (e.g., have a repeatable measurement over a 50 mm range using a cylindrical magnet that is only 6 mm long).

In one embodiment, the invention provides a relatively simple system to make repeatable measurements. The system includes a small magnet and several "collector" plates or collectors. The collectors collect and concentrate the flux on one, or more, magnetic sensors. In one embodiment, the ratio of two magnetic sensor signals is used to identify the relative position of the magnet. In another embodiment, a magnetic angle sensor is used to sense the flux angle. This angle is used to identify the position of the magnet.

Among other attributes, embodiments of the invention provide position measurement across a relatively large range using a small magnet. Embodiments of the invention are relatively insensitive to small variations in the gap between the magnet and the measurement system. In addition, embodiments are compatible with available "off-the-shelf" sensing devices.

In one embodiment, the invention provides a magnetically-based position sensor. The sensor includes a magnet assembly that moves along a path, a common collector, one or more magnetic sensing elements, a first variable collector, and a second variable collector. The one or more magnetic sensing elements are coupled to the common collector. The first and second variable collectors are coupled to one of the one or more magnetic sensors and are configured to collect a magnetic field. The first and second variable collectors are positioned to transmit some of the magnetic flux generated by the magnet as the magnet moves along the path. The first variable collector and the second variable collector have a geometry and orientation such that the flux collected by the first and second variable collectors varies as the magnet moves along the path, the variation of the flux collected by the first variable collector being different than the variation of the flux collected by the second variable collector.

Other aspects of the invention will become apparent by consideration of the detailed description and accompanying drawings.

BRIEF DESCRIPTION OF THE DRAWINGS

FIG. 5 is a schematic representation of another position measuring system.

FIGS. 6A and 6B show the position measuring system of FIG. 5 with a magnet positioned at opposite ends of the system.

FIG. 7 is a graph of the ratio of the outputs of the position measuring system of FIG. 5.

FIGS. 8A and 8B are cut-away side views of the system of FIG. 5 as depicted in FIGS. 6A and 6B, respectively.

FIGS. 10A and 10B are another alternative construction of the system shown in FIGS. 8A and 8B.

FIGS. 13A and 13B are cut-away side views of an alternative construction of a position measuring system.

FIG. 14A is a schematic representation of another position measuring system.

FIG. 14B is a graph of the ratio of the outputs of the position measuring system of FIG. 14A.

FIG. 15A is a schematic representation of another position measuring system.

FIG. 15B is a graph of the ratio of the outputs of the position measuring system of FIG. 15A.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. In addition, no single element or feature should be deemed indispensable or essential merely because it is described as part of a particular embodiment or example explained or set forth herein.

Figure 1:
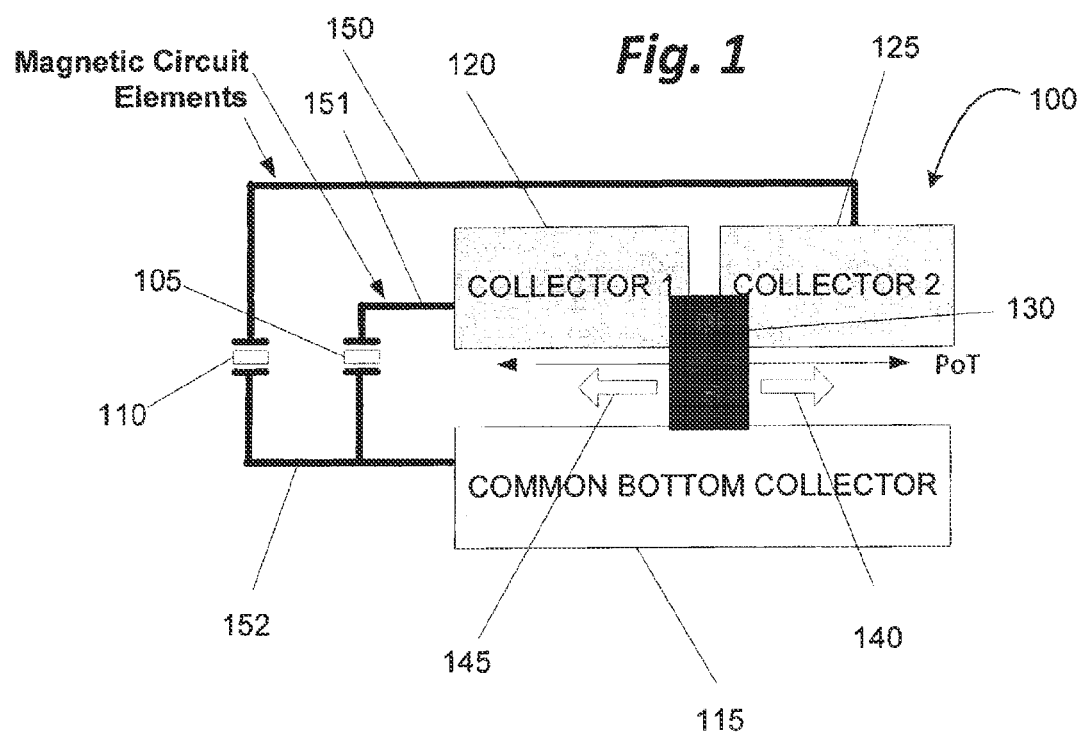
FIG. 1 is a schematic representation of a position measuring system.

FIG. 1 shows a position measuring system 100. The system 100 includes a first magnetic sensing element (e.g., a Hall Effect sensor) 105, a second magnetic sensing element (e.g., a Hall Effect sensor) 110, a common collector 115, a first variable collector 120, a second variable collector 125, and a magnet 130. The common collector 115 is magnetically coupled via magnetic circuit element 152 to both the first and second magnetic sensing elements 105 and 110. The first collector 120 is magnetically coupled via magnetic circuit element 151 to the first magnetic sensing element 105, and the second collector 125 is magnetically coupled via magnetic circuit element 150 to the second magnetic sensing element 110.

In the construction shown, the first collector 120 is positioned in the same plane and adjacent (e.g., along the path of travel, labeled "PoT" in the drawings, of the magnet 130) to the second collector 125. The first collector 120 and the second collector 125 are positioned relative to the magnet 130 such that a significant percentage of the magnet's flux flows through the collectors 120 and 125 to the first and second magnetic sensing elements 105 and 110, and then to the common collector 115 and back to the magnet 130.

The collectors 120 and 125 and the magnetic circuit elements 150, 151, and 152 are made of materials with relatively high permeability. The magnet 130 is magnetized in the direction perpendicular to the direction of magnet travel (the direction of magnet travel is shown by the arrows 140 and 145 on either side of the magnet). The magnet 130 is located "in front" of the collectors 115, 120, and 125 and moves parallel to the plane of the collectors 120 and 125.

Figure 2:
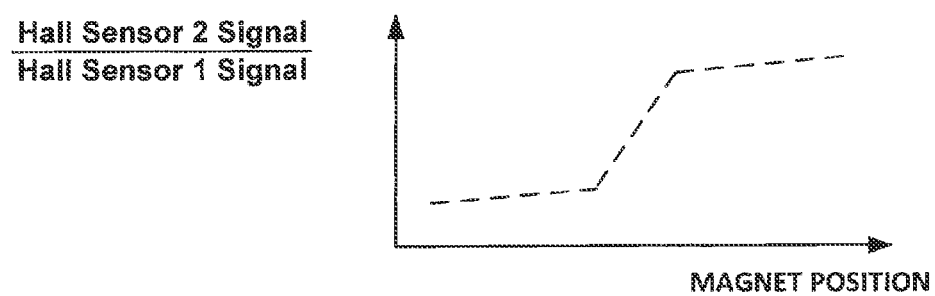
FIG. 2 is a graph of the ratio of the outputs of the position measuring system of FIG. 1.

As the magnet travels toward the second collector 125 (i.e., in the direction of arrow 140), the amount of the flux being collected by the second collector 125 and traveling through the second magnetic sensing element 110 increases and the amount of the flux being collected by the first collector 120 and traveling through the first magnetic sensing element 105 decreases. By calculating a ratio (e.g., the second sensor 110 signal divided by the first sensor 105 signal), the position of the magnet can be determined. FIG. 2 shows the ratio of the two signals generated by the first and second magnetic sensing elements 105 and 110 based on the position of the magnet 130, allowing identification of the position of the magnet 130.

In some embodiments, the signals produced by first and second magnetic sensing elements 105 and 110 can be input into a microprocessor which could perform a calculation and identify the position of the magnet. In an alternative embodiment, the signals are provided to a hardware comparator which identifies the magnet's position. In the construction shown in FIG. 1, the position information is limited to the region near the mid-point between the first and second collectors 120 and 125. Once the magnet is fully "in front" of either of the two collectors, the ratio does not change sufficiently enough to precisely identify the position of the magnet 130.

Figures 3, 4:
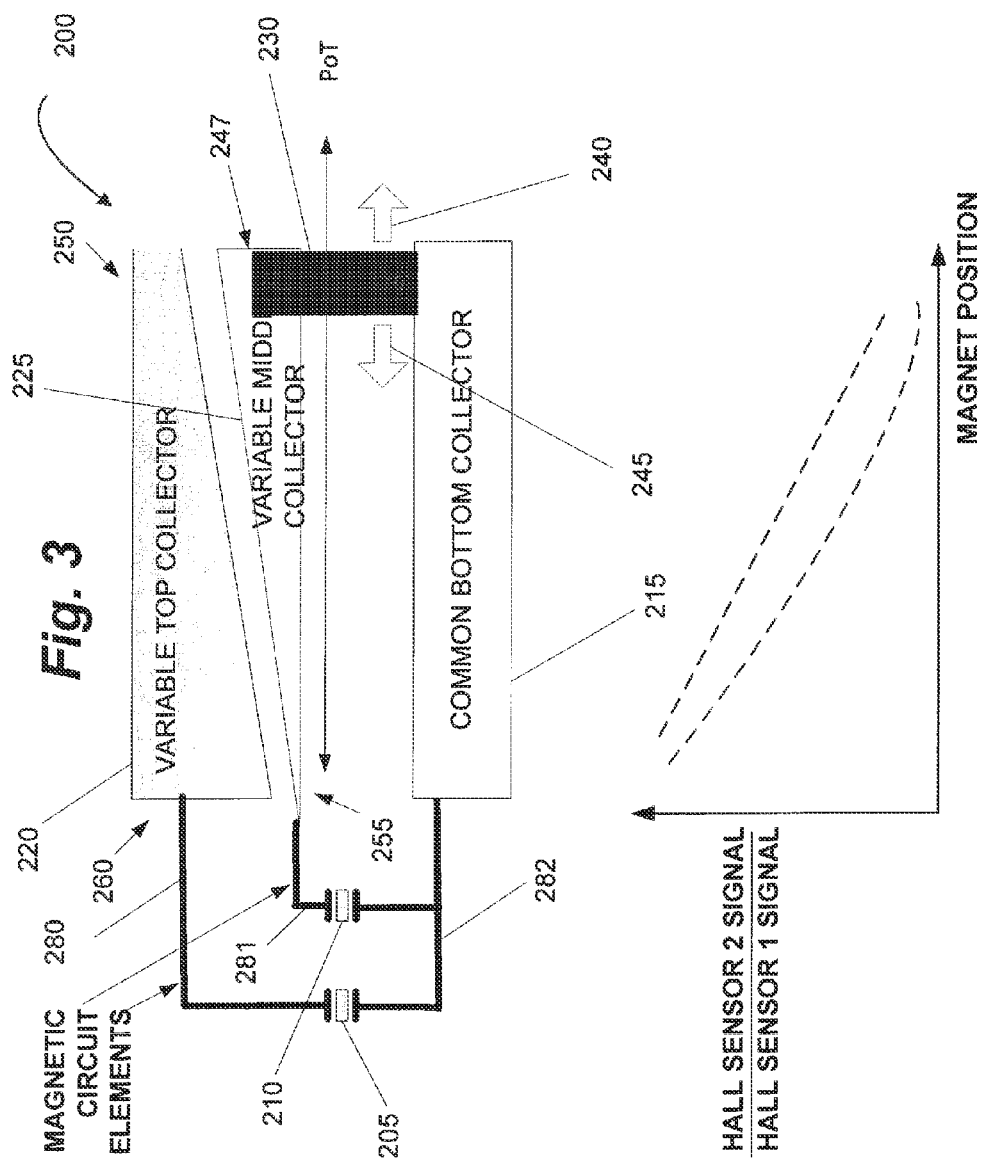
FIG. 3 is a schematic representation of another position measuring system.
FIG. 4 is a graph of the ratio of the outputs of the position measuring system of FIG. 3.

FIG. 3 shows another construction of a position measuring system 200. The system 200 is similar to the system 100 and includes a first magnetic sensing element (e.g., a Hall Effect sensor) 205, a second magnetic sensing element (e.g., a Hall Effect sensor) 210, a common collector 215, a first variable collector 220, a second variable collector 225, and a magnet 230. The common collector 215 is magnetically coupled by magnetic circuit element 282 to both the first and second magnetic sensing elements 205 and 210. The first collector 220 is magnetically coupled by magnetic circuit element 280 to the first magnetic sensing element 205, and the second collector 225 is magnetically coupled by magnetic circuit element 281 to the second magnetic sensing element 210. Magnetic circuit elements 280, 281, and 282 provide a low reluctance path between the collectors 215, 220, and 225 and the sensing elements 205 and 210.

In the construction shown, the first collector 220 is positioned in the same plane and adjacent to the second collector 225. In the illustrated configuration, the second collector 225 is below the first collector 220. The first collector 220 and the second collector 225 are positioned relative to the magnet 230 such that a significant percentage of the magnet's flux flows through the collectors 220 and 225 to the first and second magnetic sensing elements 205 and 210, and then to the common collector 215 and back to the magnet 230.

In this construction, the collectors 220 and 225 have a generally triangular shape (e.g., they may have a squared off end) and are positioned such that a wide end 247 of the second collector 225 is positioned adjacent a narrow end 250 of the first collector 220, and a narrow end 255 of the second collector 225 is positioned adjacent a wide end 260 of the first collector 220.

Like the magnet 130, the magnet 230 is magnetized in the direction perpendicular to the direction of magnet travel. As should be apparent from the drawings (the direction of magnet travel is generally linear and reciprocating in the directions shown by the arrows 240 and 245 on either side of the magnet). The magnet 230 is located "in front" of the collectors 220 and 225 and moves parallel to the plane of the collectors 220 and 225.

The signal output by the first magnetic sensing element 205 has a greater magnitude when the magnet 230 is positioned nearer the wide end 260 of the first collector 220. The signal output by the sensing element 205 has a smaller magnitude when the magnet 230 is positioned nearer the narrow end 250 of the first collector 220. The signal output by the second magnetic sensing element 210 varies in a similar manner, but because of the orientation of the collectors 220 and 225, the magnitudes of the signals output by the sensors 205 and 210 vary inversely. Thus, as shown in FIG. 4, the ratio of the two signals generated by the first and second magnetic sensing elements 205 and 210 allow determination of the position of the magnet 230 along the entire length of magnet travel. The range of travel is not limited by the size of the magnet 230. If the variable collectors 220 and 225 are lengthened, the range of the system 200 is also lengthened. However, the resolution falls as the collectors are lengthened (i.e., the change of the ratio per unit distance traveled decreases). Depending on the application, a reduced resolution may be acceptable. The two dashed lines in FIG. 4 are examples of possible outcomes of the ratio of the signals, and show the trend of the signal, illustrating that the ratio may change linearly or non-linearly with the magnet position.

In the constructions shown, the magnetic flux travels through the collectors and the magnetic circuit elements associated with each collector, and each collector and magnetic circuit element pair is a single magnetic collector assembly. For example, in FIG. 3, the collector 220 and magnetic circuit element 280 combine to form a single magnetic collector assembly. A single piece of material is used for each separate collector assembly (i.e. including a collector and its associated magnetic circuit element), and has a high magnetic permeability and a low magnetic hysteresis. In other constructions, the collectors and the magnetic circuit elements can be separate pieces of material, or take the shape of a single simple piece of material (i.e., the collector assembly includes just the collector).

FIG. 5 shows another position measuring system 300. The system 300 is similar to the system 200 (see FIG. 3) except that instead of first and second magnetic sensing elements, an angle sensor 307 is used. The angle sensor 307 is magnetically coupled via magnetic circuit elements 380, 381, and 382 to both the first and second collectors 320 and 325, and the common collector 315. In this case, some of the magnetic flux travels from the magnet 330, to first and second collectors 320 and 325, through the angle sensor 307, to the common collector 315 and back to the magnet 330. The angle sensor 307 senses the flux angle in the gap where the magnetic circuit elements 380, 381 from the first and second collectors 320 and 325 come together with the magnetic circuit element 382 from the common collector 315.

The angle sensor 307 could be a single sensor or a combination of sensors that effectively measure two orthogonal components of the flux density such that a change in the flux angle will result in a change in the measurement (e.g., commercially available angle sensors from manufacturers including NXP, Infineon, and Micronas). Some of these sensors are based on Hall Effect technology, while others are based on a type of magnetoresistive sensor. However, even two discrete sensors (e.g., Hall sensors, coil-based fluxgates, etc.) can be used to measure two components of the flux density to identify a change in the flux angle, and thus a change in the magnet position.

FIGS. 6A and 6B illustrate a measured flux angle 370 when the magnet 330 is positioned near the narrow end 350 of the first collector 320 (FIG. 6A) and when the magnet 330 is positioned near the wide end 360 of the first collector 320 (FIG. 6B). FIG. 7 shows a graph of example possible measured flux angles as the magnet 330 is moved along its path of travel.

FIGS. 8A and 8B show a representation of a side view of the system 300 when the magnet 330 is positioned near the narrow end 350 of the first collector 320 (FIG. 8A) and when the magnet 330 is positioned near the wide end 360 of the first collector 320 (FIG. 8B). FIGS. 8A and 8B illustrate how the first collector 320 is collecting more flux when the magnet 330 is positioned near the narrow end 355 of the second collector 325 and the wide end 360 of the first collector 320, and how the second collector 325 is collecting more flux when the magnet 330 is positioned near the wide end 347 of the second collector 325 and the narrow end 350 of the first collector 320. In this construction, the first and second collectors 320 and 325 are both in the same plane P1.

Figure 9B:
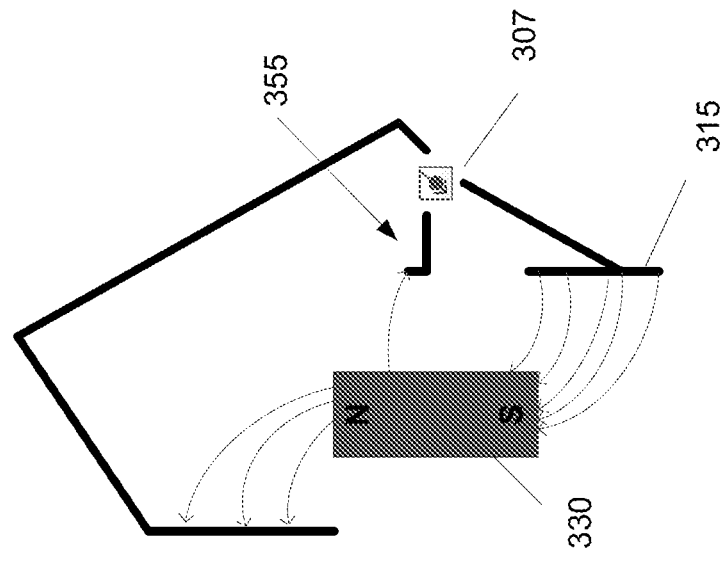
FIGS. 9A and 9B are an alternative construction of the system shown in FIGS. 8A and 8B.
Figure 9A:
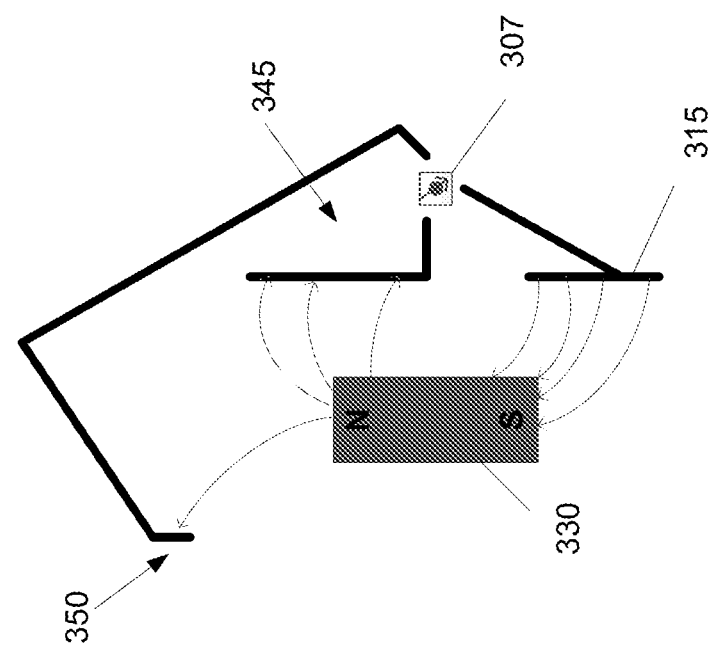

FIGS. 9A and 9B show an alternative construction of the system 300 where the first collector 320 is located on an opposite side of the magnet 330 from the second collector 325.

FIGS. 10A and 10B show a side view of a system 400, similar to the system 300, except that the first and second collectors 420 and 425 are positioned in different planes (e.g., the second collectors 425 are in plane P1 and the first collectors 420 are in plane P2).

In the constructions described above, the magnet can be any kind of permanent magnet (e.g., a ferrite, an alnico, a samarium-cobalt, a neodymium-iron-boron, or other type of magnet). It is also possible for the magnet to be an active magnetic field generator, like an electro-magnet, although in most applications a permanent magnet will be selected because of the lower system cost.

Figure 11A:
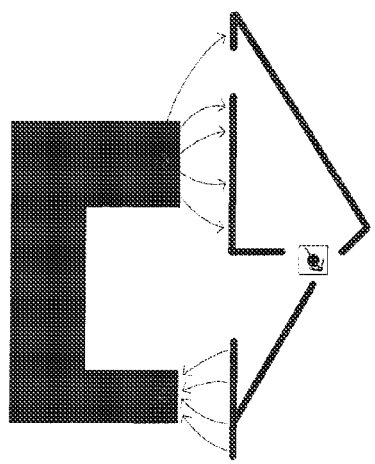
FIGS. 11A, 11B, 12A, and 12B show cut-away side views of a position measuring system as depicted in FIGS. 6A and 6B with different shaped magnets.
Figure 11B:
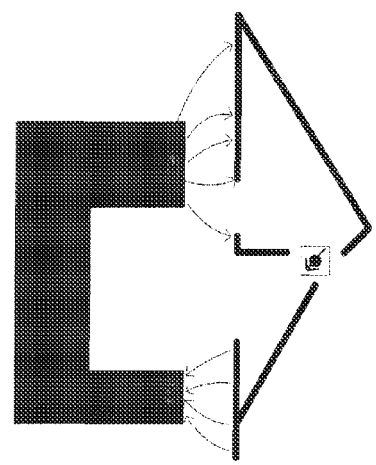
Figure 12A:
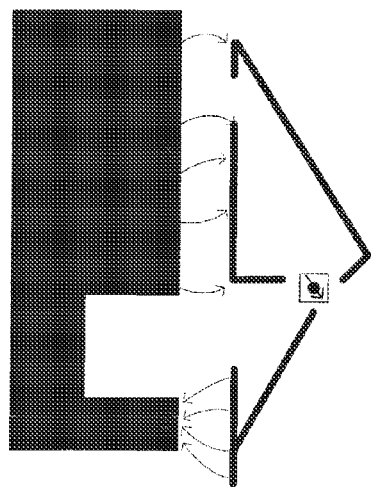
Figure 12B:
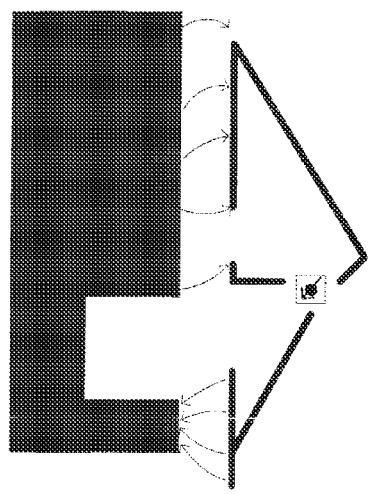

Also in the constructions described above, the magnets have a simple shape. However, it is also possible to use magnets of other shapes to improve performance or meet packaging constraints. As an example, the magnets could take on a "U" shape to better direct the flux lines to the collectors (see FIGS. 11A and 11B). In addition, the magnets could take on a shape to reduce the influence of movement in the direction orthogonal to the movement the system is trying to measure. For example the magnet poles could be wider or narrower than the collectors so that movement "up" or "down" would have a much smaller influence on the coupling between the magnet poles and the relevant collector (see FIGS. 12A and 12B). In addition, the magnets in this description may include pole pieces as part of a magnet assembly.

FIGS. 13A and 13B show a system 500 where the magnet 530 is part of a common collector assembly 532. In this case the common collector assembly 532 also includes an additional magnetic element 533. The moving element 534 is a pole piece that directs the magnetic flux, but is not the source of the flux. In other constructions, the circuit arrangement of FIGS. 13A and 13B include magnetic sensing elements instead of the angle sensor 507.

FIGS. 14A, 14B, 15A, and 15B show alternative constructions of a position measuring system 700 and 800. The shapes of the first and second collectors 720/820 and 725/825 are customized to provide different outputs based on the position of the magnet 730/830. The customization allows different or additional data to be generated as compared to other embodiments such as 1) increased resolution in certain areas and 2) information regarding a range within which the magnet 730/830 is positioned. In the Figures, the first and second collectors 720/820 and 725/825 are shown having complementary geometric shapes (i.e., they fit into each other); however, the shapes of the first and second collectors 720/820 and 725/825 could be completely different from one another. The customized geometric shapes of the collectors can be virtually any shape.

For repeatable sensor performance it is important that the collectors and their associated magnetic circuits stay approximately fixed relative to each other. Therefore, the collectors are held in place with mechanical constraints. For example, the collectors could be held in place with over-molded plastic supports or with potting.

It is also important that the sensors are held in place relative to the magnetic circuit elements and the magnetic flux concentrators directing the flux to the sensor(s).

In the constructions using magnetic sensing elements, the sensor itself is preferably a Hall Effect sensor or other magnetic sensor that can measure flux density. In the constructions using a magnetic angle sensor, the sensor can be a magnetoresistive sensor (e.g., AMR, GMR, and TMR) or a Hall-based angle sensor (normally multiple Hall sensors in a single device are used to collectively measure the angle of the magnetic flux). Other technologies that can measure flux angle can also be used.

The collectors and magnetic circuit elements are depicted above as simple shapes, but they could be complex 3-dimensonal shapes. For example, the collector could be relatively flat with a tab coming out of one edge (top edge, bottom edge, or side edges), perpendicular to the collector, and eventually leading to the sensor area. The magnetic circuit elements leading to the sensor(s) could be any shape and connected anywhere on the collectors. In other constructions, the sensor could be placed directly next to the collector such that there is no identifiable magnetic circuit element coming from the collector. Those knowledgeable in the art will recognize that this does not change the concepts within this invention.

The flux collector and magnetic circuit elements are designed to be compatible with the flux densities expected within the application. The design considers the flux level at which the collector or the magnetic circuit element may saturate. Saturation causes the magnetic circuit reluctance to change and will, as a consequence, change the measurement from the expected measurement for the magnet's position.

The constructions described above show the common collector to be a fixed shape. This shape is used to illustrate the concept, but the common collector's shape and relative orientation can be modified to optimize sensor response.

Also, the orientation of the magnet (distance between the collectors and the magnet) and the relative orientation of the magnet with respect to the collectors can also be modified.

It is also possible to create collectors that follow the path of a magnet when the magnet does not travel in a straight line. For example, if a magnet travels along a curve, the collectors could be designed to fit along the inside or outside of the curve and, as long as the distance between the magnet and the collectors is approximately constant, the output signal (ratio or angle) would vary continuously with the magnet position.

The examples have used the ratio of two flux densities or the angle of the flux as the indication of magnet assembly position, but other derived measures could be used to calculate the position. These measures include the difference between the two flux densities at the two sensor locations, or the difference divided by the sum of the measured flux densities. The latter provides a normalization for sensitivity variations caused by changes in the magnet strength, the gap between the magnet assembly and the collector, etc. Additional collectors and magnetic sensing elements could be used to add additional information about the position of the magnet.

Various features and advantages of the invention are set forth in the following claims.

What is claimed is:

1. A magnetically-based position sensor comprising:
   a magnet assembly that moves along a path;
   a common collector having a first end and a second end;
   one or more magnetic sensing elements coupled to the common collector;
   a first variable collector coupled to one of the one or more magnetic sensing elements and configured to collect a magnetic flux; and
   a second variable collector coupled to one of the one or more magnetic sensing elements and configured to collect a magnetic flux;
   wherein the first and second variable collectors are positioned to transmit some of the magnetic flux generated by the magnet assembly as the magnet assembly moves along the path; and
   wherein the first variable collector has a geometry and orientation such that the flux density at one of the one or more magnetic sensing elements is greater when the magnet assembly is positioned near the first end, and less when the magnet assembly is positioned near the second end, and the second variable collector has a geometry and orientation such that the flux density at one of the one or more magnetic sensing elements is greater when the magnet assembly is positioned near the second end, and less when the magnet assembly is positioned near the first end.

2. The system of claim 1, wherein the first variable collector is positioned adjacent the second variable collector.

3. The system of claim 2, wherein the first variable collector is positioned in a first plane and the second variable collector is positioned in a second plane different from the first plane.

4. The system of claim 1, wherein the first variable collector is positioned above the second variable collector with respect to the common collector.

5. The system of claim 1, wherein the first and second variable collectors each have a first end and a second end, the first end larger than the second end.

6. The system of claim 1, wherein a largest linear dimension of the magnet assembly is less than 15% of the length of travel of the magnet assembly.

7. The system of claim 1, wherein the one or more magnetic sensing elements are Hall Effect sensors.

8. The system of claim 6, wherein the first variable collector is coupled to a first Hall Effect sensor and the second variable collector is connected to a second Hall Effect sensor.

9. The system of claim 1, wherein the magnetic sensing element is a magnetic angle sensor.

10. The system of claim 9 wherein the first and the second variable collectors are coupled to a single magnetic angle sensor.

11. The system of claim 1, wherein the first variable collector is positioned on a first side of the magnet and the second variable collector is positioned on a second side of the magnet assembly opposite the first side.

12. The system of claim 1, wherein the ratio of the magnetic flux sensed by a first magnetic sensing element to a second magnetic sensing element indicates the position of the magnet assembly.

13. The system of claim 1, wherein the first and second variable collectors have a geometric shape providing generation of data with increased resolution in parts of the path of the magnetic assembly.

14. The system of claim 13, wherein the geometric shape of the first variable collector is complementary to the geometric shape of the second variable connector.

15. The system of claim 1, wherein the path the magnet assembly moves along is curved.

16. The system of claim 15, wherein the first and second variable collectors are curved along a path of travel of the magnet assembly.

17. The system of claim 1, wherein the magnet assembly is shaped to direct the magnetic flux to the first and second variable collectors.

\* \* \* \* \*